United States Patent [19]
Yach et al.

[11] Patent Number: 6,150,864
[45] Date of Patent: Nov. 21, 2000

[54] TIME DELAY CIRCUIT WHICH IS VOLTAGE INDEPENDENT

[76] Inventors: Randy L. Yach, 16238 S. 125th St., Phoenix, Ariz. 85048; Kent Hewitt, 2731 W. Kent Dr., Chandler, Ariz. 85224; David M. Susak, 3156 Woodland Dr., Phoenix, Ariz. 85048

[21] Appl. No.: 09/138,714
[22] Filed: Aug. 24, 1998
[51] Int. Cl.⁷ .................................................. H03H 11/26
[52] U.S. Cl. .................................... 327/288; 327/264
[58] Field of Search .................................... 327/261, 262, 327/264, 268, 285, 288, 290, 378, 333, 284

[56] References Cited

U.S. PATENT DOCUMENTS

| | | | |
|---|---|---|---|
| 5,057,722 | 10/1991 | Kobatake | 327/288 |
| 5,926,042 | 7/1999 | Talaga, Jr. | 327/45 |
| 5,929,681 | 7/1999 | Suzuki | 327/284 |

*Primary Examiner*—Timothy P. Callahan
*Assistant Examiner*—Minh Nguyen
*Attorney, Agent, or Firm*—Baker Botts L.L.P.

[57] ABSTRACT

A time delay circuit that produces a constant delay and is independent of supply voltage. The time delay circuit has a current mirror circuit, a voltage shift circuit, an inverter and a capacitor. The inverter will trip at a predetermined voltage level. A capacitor is coupled to the current mirror circuit and to the inverter for generating a portion of the delay time. A voltage shift circuit is coupled to the inverter for approximately mirroring a voltage shift in the current mirror circuit thereby allowing the time delay circuit to be voltage independent.

12 Claims, 2 Drawing Sheets

TIME DELAY CIRCUIT WHICH IS VOLTAGE INDEPENDENT

BACKGROUND OF THE INVENTION

1. Field of the Invention

This invention relates generally to delay circuits and, more specifically, to a time delay circuit which is voltage independent thereby allowing the time delay circuit to generate a more constant time delay.

2. Description of the Prior Art

Currently, most time delays on integrated circuits are implemented with a Resistor-Capacitor (RC) time constant circuit. The RC time constant circuits may further be used for clocking a counter to create longer delays. The major problem with RC based time delay circuits is that the delay varies significantly with the supply voltage $V_{dd}$. As the supply voltage $V_{dd}$ fluctuates, the RC based time delay circuit will trip at different voltage levels thereby causing the circuit to generate different delay times. Thus, in the prior art Resistor-Capacitor (RC) time delay circuits, the voltage across the resistor changes as the capacitor is being charged. This reduces the charging current thereby charging the capacitor in a non-linear manner.

Therefore, a need existed to provide an improved time delay circuit. The improved time delay circuit will be voltage independent. The improved time delay circuit will be voltage independent thereby allowing the improved time delay circuit to have a more constant trip point and thus generate a more constant time delay.

SUMMARY OF THE INVENTION

In accordance with one embodiment of the present invention, it is an object of this invention to provide an improved time delay circuit.

It is another object of the present invention to provide an improved time delay circuit that is voltage independent.

It is still another object of the present invention to provide an improved time delay circuit that is voltage independent thereby allowing the improved time delay circuit to have a more constant trip point and thus generate a more constant time delay.

BRIEF DESCRIPTION OF THE PREFERRED EMBODIMENTS

In accordance with one embodiment of the present invention, a time delay circuit that is voltage independent is disclosed. The time delay circuit has a current mirror circuit. An inverter is coupled to the current mirror circuit that will trip at a predetermined voltage level. A voltage shift circuit is coupled to the inverter for approximately mirroring a voltage shift in the current mirror circuit. A capacitor is coupled to the current mirror circuit and to the inverter for generating a portion of the delay time.

In accordance with another embodiment of the present invention, a time delay circuit that is voltage independent is disclosed. The time delay circuit has a current mirror circuit. An inverter is coupled to the current mirror circuit and is designed to trip at a predetermined voltage level. A voltage shift circuit is coupled to the current mirror circuit and to the inverter for approximately mirroring a voltage shift in the current mirror circuit. A capacitor is coupled to the voltage shift circuit and is used to create a portion of the desired delay time.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
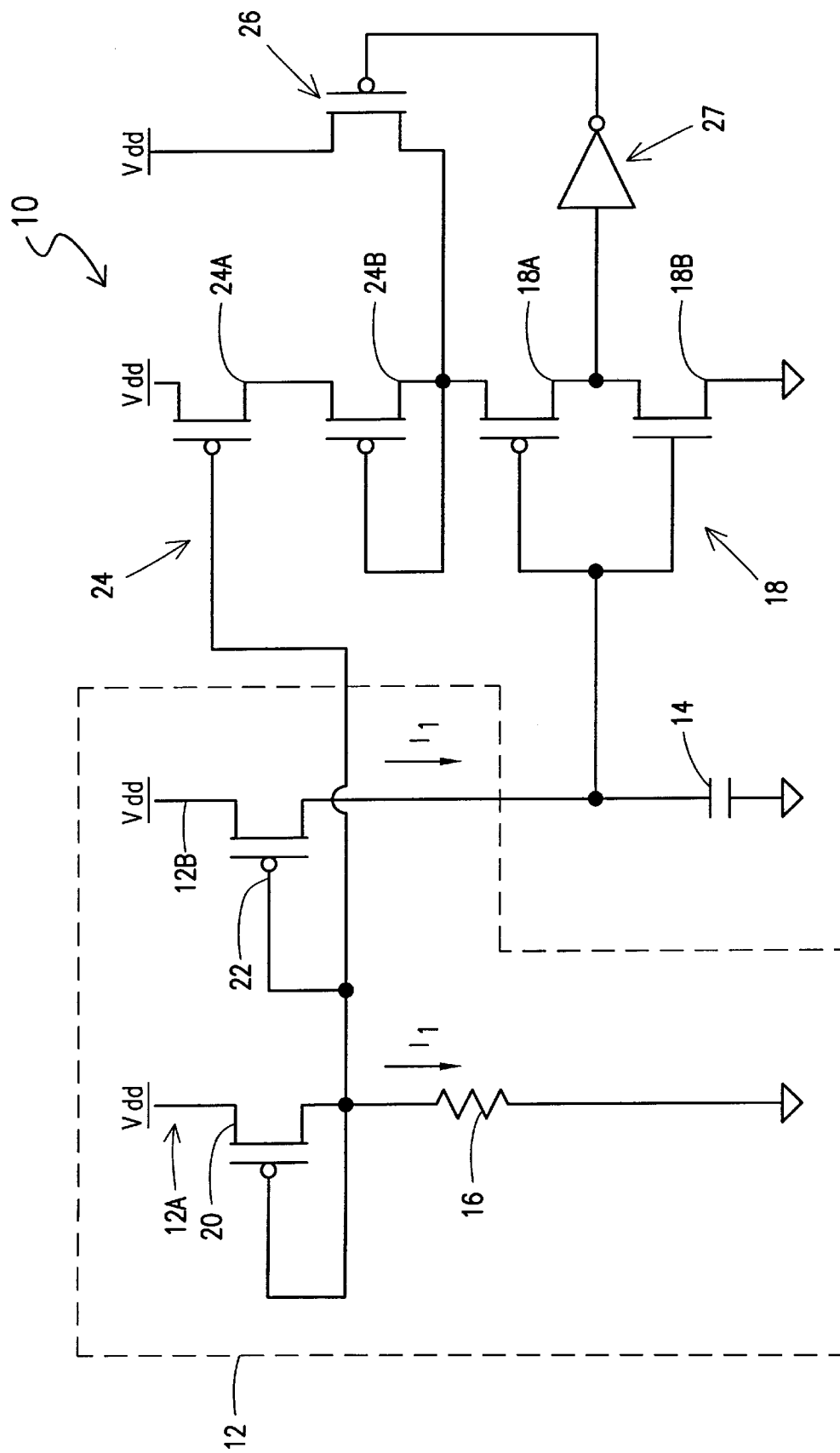
FIG. 1 is a simplified block diagram of the preferred embodiment of the voltage independent time delay circuit of the present invention.

Referring to FIG. 1, one embodiment of the voltage independent time delay circuit 10 (hereinafter circuit 10), is shown. The circuit 10 is comprised of a current mirror circuit 12, a capacitor 14, an inverter 18 and a voltage shift circuit 24.

The circuit 10 uses a current mirror circuit 12 in order to charge a capacitor 14 in a linear manner. Capacitor 14 has a first terminal connected to the current mirror circuit and to inverter 18 and a second terminal connected to the ground.

The current mirror circuit 12 is comprised of two conduction paths 12A and 12B. The current mirror circuit 12 generates a current $I_1$ in a first conduction path 12A and mirrors the current $I_1$ in a second conduction path 12B of current mirror circuit 12. The current $I_1$ in the second conduction path 12B of the current mirror circuit 12 is used to charge a capacitor 14 in a linear manner. When the capacitor 14 has been sufficiently charged, the voltage level at the input of the inverter 18 will cause the inverter 18 to trip ending the delay time of the circuit 10.

The inverter 18 is a standard inverter, which is comprised of a P-channel transistor 18A which is coupled to an N-channel transistor 18B. P-channel transistor 18A has a first terminal connected to the first terminal of transistor 18B and to the transistor 22. The second terminal of transistor 18A is connected to a second terminal of transistor 18B. The third terminal of transistor 18B is connected to ground. Those skilled in the art will recognize that by altering the width to length ratio of transistors 18A and 18B, one may alter the value at which the inverter 18 will trip. Thus, those skilled in the art may design an inverter 18 to trip at a predetermined voltage level.

In the embodiment depicted in FIG. 1, the current mirror circuit 12 has a first branch 12A and a second branch 12B. The first branch 12A has a P-channel diode connected transistor 20. Transistor 20 is coupled to a voltage source $V_{dd}$. A resistor 16 has a first terminal coupled to the transistor 20 and a second terminal coupled to the ground. The second branch 12B has a P-channel transistor 22. The transistor 22 has a first terminal coupled to the voltage source $V_{dd}$ and a second terminal coupled to the transistor 20.

The function of the circuit 10 is described below. To ensure that the circuit 10 does not change with the voltage source $V_{dd}$, the associated current and delay equations must be considered. The current $I_1$ in the current mirror circuit 12 may be defined as follows:

$$I_1 = (V_{dd} - V_{tp})/R \tag{1}$$

wherein $I_1$ is the current in each branch of the current mirror circuit 12, $V_{dd}$ is the voltage of the voltage source, $V_{tp}$ is the voltage drop across a transistor, in this case transistor 20, and R is the value of the resistor 16. The precise value of $V_{tp}$ can be controlled as part of the fabrication process. Since the current $I_1$ is used to charge the capacitor 14, the delay of the circuit 10 may be defined as:

$$\text{Delay} = C^*(V_{dd}/2)/I_1 \qquad (2)$$

wherein Delay is the delay of the circuit 10, $V_{dd}/2$ is the predetermined trip point of inverter 18, and $I_1$ is the current in each branch of the current mirror circuit 12.

Substituting the equation for $I_1$ into equation (2) gives the following equation:

$$\text{Delay} = C^*(V_{dd}/2)/((V_{dd}-V_{tp})/R) \qquad (3)$$

Rearranging the terms in equation (3) gives the following:

$$\text{Delay} = R^*(C/2)^*V_{dd}/(V_{dd}-V_{tp}) \qquad (4)$$

In order to make the delay of the circuit 10 independent of the voltage source $V_{dd}$, the $V_{dd}$ in the numerator of equation (4) must be equal to $(V_{dd}-V_{tp})$. This means that the trip point of the inverter 18 must shift by a voltage equal to $V_{tp}$. If the $V_{dd}$ in the numerator of equation (4) is equal to $(V_{dd}-V_{tp})$, then the delay is equal to:

$$\text{Delay} = R^*C/2^*(V_{dd}-V_{tp})/(V_{dd}-V_{tp}) \qquad (5)$$

or, $$\text{Delay} = R^*C/2 \qquad (6)$$

Thus, as may be seen from equation (6), the circuit 10 generates a delay time that is independent of the voltage $V_{dd}$.

To shift the trip point of the inverter 18 by a voltage equal to $V_{tp}$, a voltage shift circuit 24 is used. In the preferred embodiment, the voltage shift circuit 24 consists of a P-channel transistor 24A and a P-channel diode connected transistor 24B. Transistor 24A has a first terminal connected to the voltage source $V_{dd}$ and a second terminal connected to the transistor 22. Transistor 24B has a first terminal connected to transistor 24A and a second terminal connected to transistor 26 and to transistor 18A. Transistors 24A and 24B are designed to shift the trip point of the inverter 18 by a voltage equal to $V_{tp}$. The $V_{tp}$ across transistor 24B must be the same as the $V_{tp}$ across transistor 20. Transistor 24A causes this by further mirroring current $I_1$ into transistor 24B. The result is that the delay of the circuit 10 is independent of the voltage source $V_{dd}$.

Since inverter 18 can now only drive a high level $(V_{dd}-V_{tp})$ P channel transistor 26 and the inverter 27 are used to change the high state output of the inverter 18 to $V_{dd}$, once the delay is complete. Inverter 27 has a first terminal connected to the second terminal of transistor 18A. P-channel transistor 26 has a first terminal coupled to inverter 27 and a second terminal coupled to a voltage source $V_{dd}$.

Figure 2:
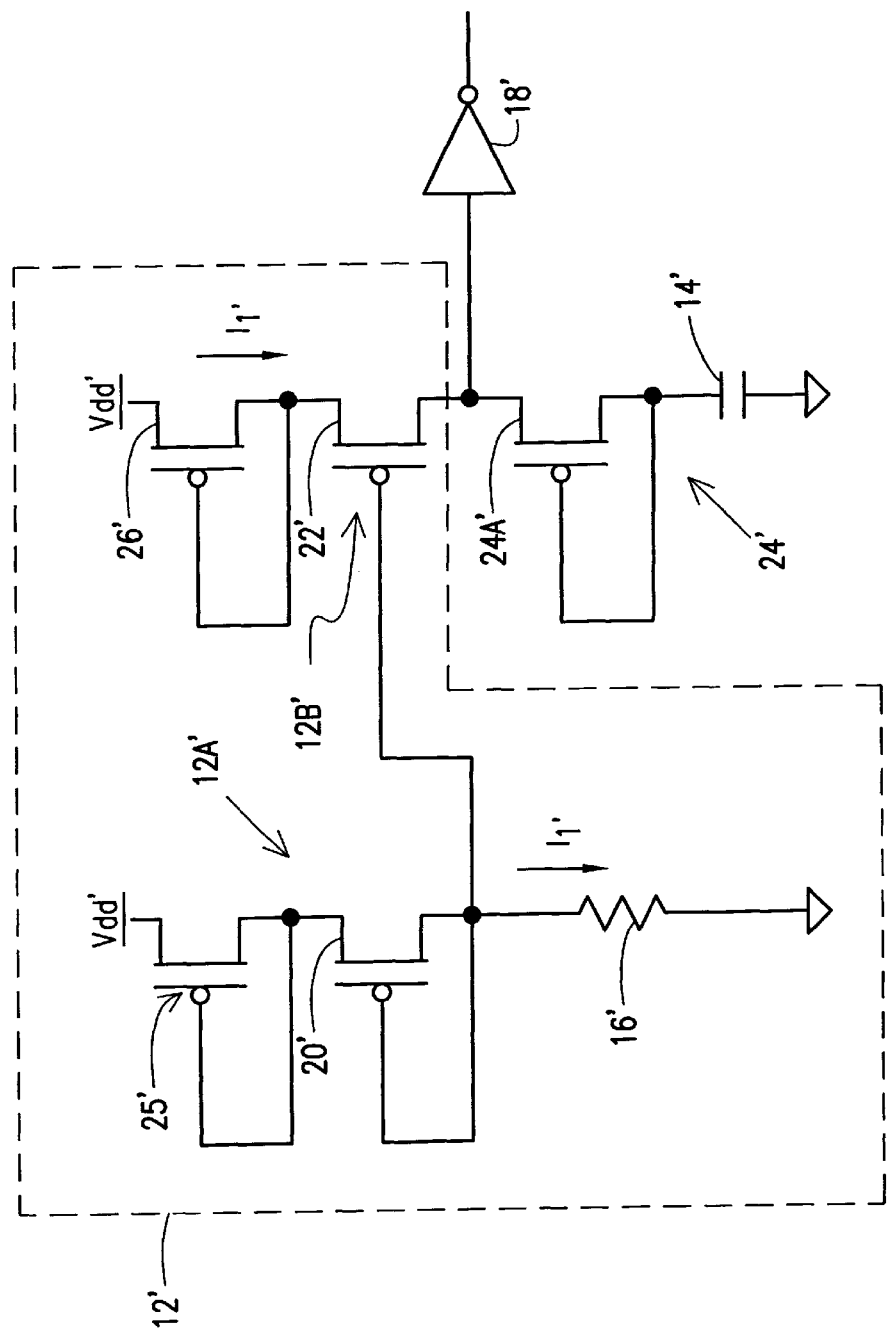
FIG. 2 is a simplified block diagram of an alternate embodiment of the voltage independent time delay circuit of the present invention.

FIG. 2 represents a second embodiment of the voltage independent time delay circuit 10, wherein like numerals and symbols represent like elements with the exception of use of "'". The circuit 10' uses a current mirror circuit 12' with two conduction paths to charge the capacitor 14' in a linear manner. The first conduction path 12A' has two P-channel diode connected transistors 20' and 25'. The transistor 25' has the first terminal coupled to a voltage source $V_{dd}$' and the second terminal coupled to the transistor 20'. A resistor 16' has a first terminal coupled to transistor 20' and a second terminal coupled to ground.

The second conduction path 12B' has a P-channel diode connected transistor 26' and a P-channel transistor 22'. The transistor 26' has a first terminal coupled to the voltage source $V_{dd}$'. The transistor 22' has a first terminal coupled to a transistor 26'. A second terminal of the transistor 22' is coupled to the diode connected transistor 20'. A third terminal of the transistor 22' is coupled to the inverter 18'. A P-channel diode connected transistor 24A' has a first terminal coupled to the inverter 18' and to the current mirror circuit and a second terminal coupled to the capacitor 14'. The capacitor 14' has a first terminal coupled to the transistor 24A' and a second terminal coupled to ground.

An inverter 18' is coupled to the current mirror circuit 12'. The inverter 18' is a standard inverter comprising of a P-channel transistor coupled to an N-channel transistor.

The current mirror circuit 12' generates a current $I_1$' in a first conduction path 12A' and mirrors the current $I_1$' in a second conduction path 12B' of the current mirror circuit 12'. The current $I_1$' in the second branch 12B' of the current mirror circuit 12 charges capacitor 14'. When the capacitor 14' has been sufficiently charged, the voltage level at the input of the inverter 18' will cause inverter 18' to trip, ending the delay time of the circuit 10'.

The size of the capacitor 14' in conjunction with the size of a resistor 16' in the current mirror circuit 12' is used to determine the delay time of the circuit 10'.

The circuit 10' of FIG. 2, as described above, functions in accordance with the equations put forward below.

$$I_1' = (V_{dd}-2V_{tp})/R' \qquad (7)$$

wherein $I_1$' is the current in each branch of the current mirror circuit 12', $V_{dd}$ is the voltage of the voltage source, $V_{tp}$ is the voltage drop across a transistor, in this case transistor 20', and R' is the value of the resistor 16'. Since the current $I_1$' is used to charge the capacitor 14', the delay of the circuit 10' may be defined as:

$$\text{Delay} = C'^*(V_{dd}/2)/I_1' \qquad (8)$$

wherein Delay is the delay of the circuit 10', $V_{dd}/2$ is the predetermined trip point of inverter 18, and $I_1$' is the current in each branch of the current mirror circuit 12'.

However, by factoring the voltage drop across transistor 24A, the delay equation then becomes:

$$\text{Delay} = C'^*(V_{dd}/2-V_{tp})/I_1' \qquad (9)$$

Substituting the equation for $I_1$' into equation (9) gives the following equation:

$$\text{Delay} = C'^*(V_{dd}/2-V_{tp})/((V_{dd}-2V_{tp})/R') \qquad (10)$$

Rearranging the terms in equation (10) gives the following:

$$\text{Delay} = 2^*R'^*C'^*(V_{dd}-2V_{tp})/(V_{dd}-2V_{tp}) \qquad (11)$$

or, $$\text{Delay} = 2^*R'^*C' \qquad (12)$$

Thus, as may be seen from equation (12), the circuit 10' generates a delay time that is independent of the voltage $V_{dd}$.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A voltage independent time delay circuit comprising:
   a current mirror circuit having an output and being coupled to a voltage source;
   a first inverter circuit constructed and designed to trip at a predetermined voltage level, the first inverter having an input coupled to the output of the current mirror circuit;
   a voltage shift circuit comprising a transistor coupled to the voltage source and a diode connected transistor coupled to the transistor and to the first inverter, wherein the voltage shift circuit is coupled to the current mirror circuit and to the first inverter for approximately mirroring a voltage shift in the current mirror circuit to the first inverter; and
   a capacitor coupled to the output of the current mirror circuit and to the input of the first inverter.

2. The circuit in accordance with claim 1, further comprising:
   a second inverter coupled to the first inverter; and
   a voltage boosting transistor coupled to the voltage source and to the second inverter.

3. The circuit in accordance with claim 1 wherein the current mirror circuit comprises:
   a first conduction path; and
   a second conduction path.

4. The circuit in accordance with claim 3 wherein the first conduction path comprises:
   a diode connected transistor coupled to the voltage source; and
   a resistor coupled to the diode connected transistor.

5. The circuit in accordance with claim 4 wherein the voltage shift circuit shifts a trip point of the first inverter by a voltage approximately equal to a threshold voltage of the diode connected transistor.

6. The circuit in accordance with claim 3 wherein the second conduction path comprises a transistor connected to the voltage source and to the capacitor.

7. The circuit in accordance with claim 3 wherein an electrical current in the first conduction path is approximately equal to a current in the second conduction path.

8. The circuit in accordance with claim 1 wherein the first inverter comprises:
   a first transistor coupled to the current mirror circuit and to the capacitor;
   a second transistor coupled to the first transistor.

9. The circuit in accordance with claim 1 wherein the time delay is independent of the voltage source.

10. The circuit in accordance with claim 1 wherein the first inverter has a constant trip point.

11. The circuit of claim 1, wherein the capacitor has first and second terminals, the first terminal being coupled to the current mirror circuit output and to the first inverter input, and the second terminal being coupled to a ground source.

12. The circuit of claim 1, wherein the first inverter has a power supply voltage input, and wherein the voltage shift circuit is coupled to the first inverter power supply voltage input.

* * * * *